United States Patent
Dutta et al.

(10) Patent No.: US 10,833,258 B1
(45) Date of Patent: Nov. 10, 2020

(54) MRAM DEVICE FORMATION WITH IN-SITU ENCAPSULATION

(71) Applicant: International Business Machines Corporation, Armonk, NY (US)

(72) Inventors: Ashim Dutta, Menands, NY (US); Chih-Chao Yang, Glenmont, NY (US); Daniel C. Edelstein, White Plains, NY (US); Karthik Yogendra, Albany, NY (US); John C. Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 16/402,126

(22) Filed: May 2, 2019

(51) Int. Cl.
| | |
|---|---|
| *H01L 43/02* | (2006.01) |
| *H01L 43/12* | (2006.01) |
| *H01L 27/22* | (2006.01) |
| *H01F 41/34* | (2006.01) |
| *H01L 43/10* | (2006.01) |
| *H01F 10/32* | (2006.01) |
| *G11C 11/16* | (2006.01) |

(52) U.S. Cl.
CPC ............ *H01L 43/12* (2013.01); *G11C 11/161* (2013.01); *H01F 10/3254* (2013.01); *H01F 41/34* (2013.01); *H01L 27/222* (2013.01); *H01L 43/02* (2013.01); *H01L 43/10* (2013.01)

(58) Field of Classification Search
CPC ... H01L 43/12; G11C 11/161; H01F 10/3254; H01F 41/34; H01F 27/222; H01F 43/02; H01F 43/10
USPC ........................................................ 257/427
See application file for complete search history.

(56) References Cited

U.S. PATENT DOCUMENTS

| 7,291,506 B2 | 11/2007 | Nakajima et al. |
| 9,166,154 B2 | 10/2015 | Satoh et al. |

(Continued)

FOREIGN PATENT DOCUMENTS

| CN | 107623069 A | 1/2018 |
| CN | 108242502 A | 7/2018 |

OTHER PUBLICATIONS

English Translation of CN108242502A by Zhang et al., Jul. 3, 2018 (14 pages).

(Continued)

*Primary Examiner* — Hrayr A Sayadian
(74) *Attorney, Agent, or Firm* — James Nock; Michael J. Chang, LLC (57) ABSTRACT

MRAM devices with in-situ encapsulation are provided. In one aspect, a method of forming an MRAM device includes: patterning an MRAM stack disposed on a dielectric into individual memory cell stacks, wherein the MRAM stack includes a bottom electrode, a MTJ, and a top electrode, and wherein the patterning is performed using an intermediate angle IBE landing on the dielectric; removing redeposited metal from the memory cell stacks using a high angle IBE; redepositing the dielectric along the sidewalls of the memory cell stacks using a low angle IBE to form a first layer of dielectric encapsulating the memory cell stacks; and depositing a second layer of dielectric, wherein the first/second layers of dielectric form a bilayer dielectric spacer structure, wherein the patterning, removing of the redeposited metal, and redepositing the dielectric steps are all performed in-situ. An MRAM device is also provided.

13 Claims, 4 Drawing Sheets

(56) References Cited

U.S. PATENT DOCUMENTS

| | | |
|---|---|---|
| 9,166,155 B2 | 10/2015 | Deshpande et al. |
| 9,306,157 B2 | 4/2016 | Deshpande et al. |
| 9,564,582 B2 | 2/2017 | Pakala et al. |
| 9,806,252 B2 | 10/2017 | Tan et al. |
| 9,893,275 B2 | 2/2018 | Aggarwal et al. |
| 10,043,851 B1 | 8/2018 | Shen et al. |
| 10,056,544 B2 | 8/2018 | Mudivarthi et al. |
| 10,062,839 B2 | 8/2018 | Deshpande et al. |
| 2013/0082339 A1 | 4/2013 | Aggarwal et al. |
| 2015/0255507 A1 | 9/2015 | Pakala et al. |
| 2015/0380640 A1 | 12/2015 | Deshpande et al. |
| 2016/0126454 A1 | 5/2016 | Mudivarthi et al. |
| 2016/0336509 A1 | 11/2016 | Jeong et al. |
| 2017/0125663 A1* | 5/2017 | Nagel ............... H01L 43/12 |
| 2018/0019387 A1 | 1/2018 | Tan et al. |
| 2019/0035610 A1 | 1/2019 | Yeom et al. |

OTHER PUBLICATIONS

English Translation of CN107623069A by Zhang et al., Jan. 23, 2018 (12 pages).

\* cited by examiner

MRAM DEVICE FORMATION WITH IN-SITU ENCAPSULATION

FIELD OF THE INVENTION

The present invention relates to magnetic random access memory (MRAM) devices, and more particularly, to MRAM devices and techniques for formation thereof with in-situ encapsulation in ion beam etch (IBE) chamber.

BACKGROUND OF THE INVENTION

Magnetic random access memory (MRAM) devices employ a magnetic tunnel junction (MTJ) to store information. An MTJ includes a fixed magnetic metal layer(s) separated from a free magnetic metal layer(s) by a tunnel barrier. The orientation of the free magnetic layer(s) relative to that of the fixed magnetic layer(s) is used to store the information, e.g., as a logic "1" or logic "0."

MTJs are typically formed by first depositing the various layers of the MTJ, and then patterning the layers into individual memory cells. However, the MTJ materials in MRAM devices are very sensitive to exposure to ambient oxygen and moisture.

Further, the patterning process redeposits the metals along the device sidewall. Exposure to ambient oxygen then oxidizes the redeposited metal. However, some MTJ metals such as ruthenium (Ru) remain conductive even after oxidation.

Some conventional approaches employ the use of protective layers that are deposited over the device during the patterning process to cover/protect the layers that have already been patterned. See, for example, U.S. Pat. No. 9,806,252 issued to Tan et al., entitled "Dry Plasma Etch Method to Pattern MRAM Stack" (hereinafter "U.S. Pat. No. 9,806,252"), the contents of which are incorporated by reference as if fully set forth herein. For instance, as described in U.S. Pat. No. 9,806,252 a partial etch is performed followed by the deposition of a protective layer. The etch is then completed followed by the deposition of a second protective layer. However, this process changes the diameter of the device midway down the stack, creating a step along the sidewall, which induces undesirable variability in MRAM device performance due to difficulty in precisely controlling the location of the step in the stack for each device. Further, deposition of these protective layers exposes the MTJ stack to reactive gases multiple times and poses the risk of covering over the redeposited metal on the stack sidewalls.

Therefore, techniques for protecting the device immediately after patterning using non-reactive chemistry to avoid junction damage would be desirable.

SUMMARY OF THE INVENTION

The present invention provides magnetic random access memory (MRAM) devices with in-situ encapsulation. In one aspect of the invention, a method of forming an MRAM device is provided. The method includes: patterning an MRAM stack disposed on a dielectric into individual memory cell stacks, wherein the MRAM stack includes a bottom electrode disposed on the dielectric, a magnetic tunnel junction (MTJ) disposed on the bottom electrode, and a top electrode disposed on the MTJ, and wherein the patterning of the MRAM stack is performed using an intermediate angle ion beam etch (IBE) landing on the dielectric; removing redeposited metal from sidewalls of the memory cell stacks using a high angle IBE, wherein the redeposited metal results from the patterning of the MRAM stack; redepositing the dielectric along the sidewalls of the memory cell stacks using a low angle IBE to form a first layer of dielectric encapsulating the memory cell stacks; and depositing a second layer of dielectric encapsulating the memory cell stacks, wherein the first layer of dielectric and the second layer of dielectric form a bilayer dielectric spacer structure along the sidewalls of the memory cell stacks, wherein the patterning of the MRAM stack, the removing of the redeposited metal, and the redepositing of the dielectric along the sidewalls of the memory cell stacks steps are all performed in-situ in a vacuum chamber, without breaking vacuum.

In another aspect of the invention, an MRAM device is provided. The MRAM device includes: memory cell stacks disposed on a dielectric, wherein each of the memory cell stacks includes a bottom electrode disposed on the dielectric, an MTJ disposed on the bottom electrode, and a top electrode disposed on the MTJ; a first layer of dielectric encapsulating the memory cell stacks, wherein the first layer of dielectric has a same composition as the dielectric; and a second layer of dielectric encapsulating the memory cell stacks, wherein the first layer of dielectric and the second layer of dielectric form a bilayer dielectric spacer structure along the sidewalls of the memory cell stacks.

A more complete understanding of the present invention, as well as further features and advantages of the present invention, will be obtained by reference to the following detailed description and drawings.

DETAILED DESCRIPTION OF PREFERRED EMBODIMENTS

Magnetic random access memory (MRAM) device fabrication generally involves first depositing the layers of the device as a stack onto a dielectric substrate. For instance, the stack can include a bottom electrode disposed on the dielectric, a magnetic tunnel junction (MTJ) disposed on the bottom electrode, and a top electrode disposed on the MTJ. As will be described in detail below, these layers include a variety of different metals.

A lithography and etching process is then used to pattern the stack into individual memory cells. An etching process such as ion beam etching (IBE) landing on the dielectric underneath can be used for the stack etch. IBE is a non-reactive etching process that relies on sputter induced material removal using high energy ions of noble gases. For a general description of IBE see, for example, U.S. Patent Application Publication Number 2019/0035610 by Yeom et al., entitled "Ion Beam Etching Apparatus," the contents of which are incorporated by reference as if fully set forth herein. IBE is typically carried out in a vacuum chamber (e.g., having a pressure of from about $6.0 \times 10^{-6}$ Torr to about $8.0 \times 10^{-6}$ Torr and ranges therebetween) that protects the workpiece from exposure to the ambient environment.

Since the stack etch lands on the dielectric, a foot is created in the bottom electrode at the interface with the dielectric. Conventional approaches to MRAM device fabrication typically next employ an over etch to reduce this footing at the bottom of the cell stacks. Unfortunately, with each etching step metal gets redeposited along the device sidewalls. However, the significant over etch needed to reduce the foot at the bottom of the stack also significantly etches the dielectric which gets redeposited onto the device sidewalls over the (redeposited) metal. Thus, the effectiveness of a subsequent etch to clean metal residue from the device sidewalls is tenuous at best since it needs to remove redeposited dielectric first to access the metal residue underneath.

Any metal residue that remains can be problematic. For instance, metals such as ruthenium (Ru) remain electrically conductive even when oxidized. Thus, any exposure to the ambient environment after patterning can be damaging to the MRAM device materials.

Advantageously, provided herein are techniques for MRAM device fabrication where in-situ encapsulation of the MRAM device is formed immediately after IBE inside the etch chamber thus preventing exposure of the MTJ materials when the device is subsequently removed from the chamber. An overview of the present techniques is provided in methodology 100 of FIG. 1.

Figure 1:
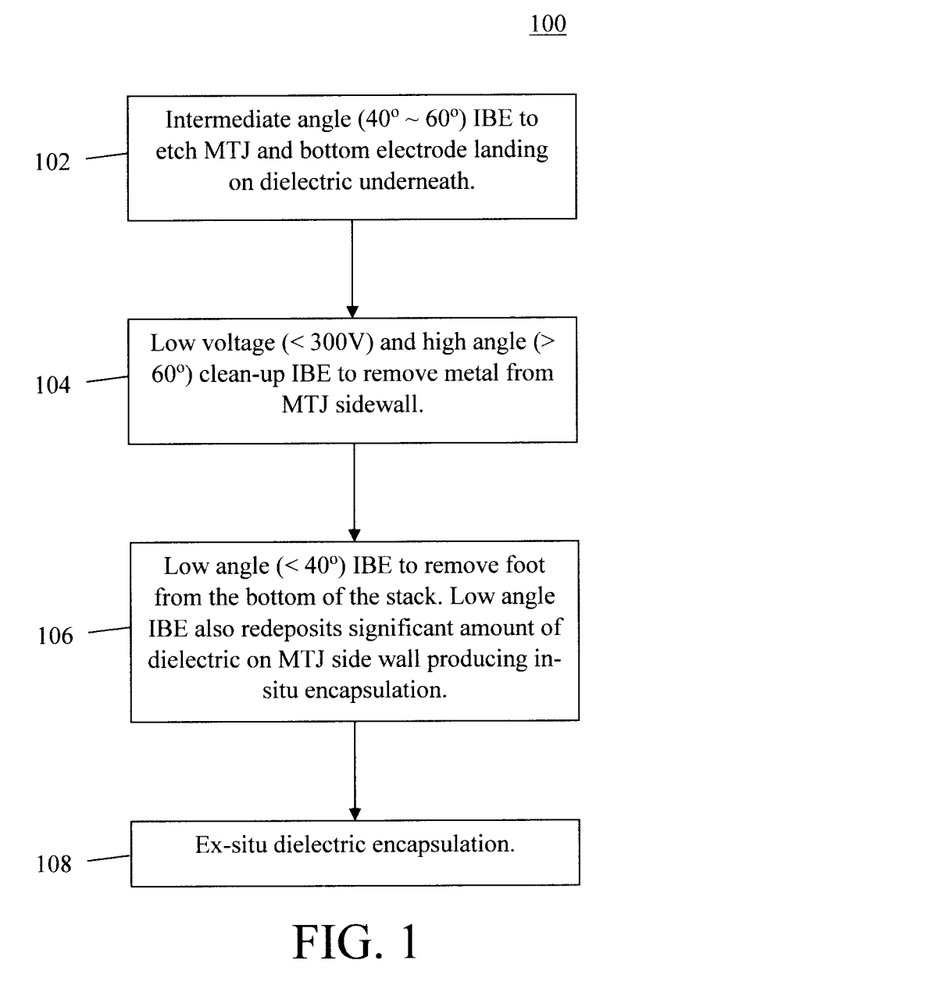
FIG. 1 is a diagram illustrating an exemplary methodology for forming a magnetic random access memory (MRAM) device according to an embodiment of the present invention.

In step 102, an IBE is used to pattern the MTJ into individual memory cells. According to an exemplary embodiment, the stack is disposed on a dielectric substrate, and the IBE of the stack lands on the underlying dielectric substrate. Suitable materials for the dielectric substrate include, but are not limited to, silicon carbonitride (SiCN (H)), silicon dioxide ($SiO_2$), silicon nitride (SiN), and/or silicon oxycarbide (SiCOH). The stack includes an MTJ sandwiched between a bottom electrode and a top electrode. According to an exemplary embodiment, each of the bottom and top electrodes are formed from a metal such as copper (Cu), platinum (Pt), palladium (Pd), nickel (Ni) and/or gold (Au).

An exemplary MTJ is described in detail below. In general however, the MTJ includes at least one free layer separated from at least one fixed or reference layer by a tunnel barrier. As highlighted above, MRAM uses magnetic memory cells to store information. Information is stored in the magnetic memory cells as an orientation of the magnetization of the free layer as compared to an orientation of the magnetization of the fixed or reference layer in each of the magnetic memory cells. The magnetization of the free layer can be oriented parallel or anti-parallel relative to the fixed layer, representing either a logic "1" or a logic "0." When the magnetic memory cell is sitting in a zero applied magnetic field, the magnetization of the magnetic memory cell is stable. Hence, the memory is nonvolatile. The application of a magnetic field can switch the magnetization of the free layer to write information to the magnetic memory cell.

According to an exemplary embodiment, the free layer(s) and the fixed layer(s) are each formed from a metal such as cobalt (Co), iron (Fe), nickel (Ni), manganese (Mn), platinum (Pt), palladium (Pd), ruthenium (Ru), and combinations thereof, e.g., alloys containing at least one of the foregoing metals such as cobalt iron boron (CoFeB). According to an exemplary embodiment, the tunnel barrier is formed from a metal oxide such as aluminum oxide (AlOx) and/or magnesium oxide (MgO).

In one embodiment, step 102 is performed using an intermediate angle IBE. By way of example only, an intermediate angle denotes a beam angle θ (relative to the surface of the workpiece—see below) of from about 40 degrees)(° to about 60° and ranges therebetween. In one embodiment, the Ion beam voltage for this step is greater than 200V. Notably, the entire stack is patterned in a single step (i.e., in step 102), thereby avoiding any undesirable changes in diameter midway down the stack as occurs with some conventional approaches (see above).

As provided above, etching the stack redeposits metal along the cell stack sidewalls. For instance, IBE of a given layer can redeposit metal from that layer along the already-patterned sidewalls of the above layer(s). This redeposited metal needs to be removed. To do so, in step 104 a low-voltage (e.g., less than 300V), high angle clean-up IBE is used to remove all of the redeposited metal from the cell stack sidewalls. This clean up etch is performed in-situ, meaning that the etch in step 104 is performed in the same vacuum chamber as step 102, without breaking vacuum between the steps.

Further, it is notable that this clean up etch is performed immediately after the stack patterning. Thus, there is at most a minimal amount of redeposited dielectric on the cell stack sidewalls. Accordingly, all of the redeposited metal can be more effectively removed. By comparison, as provided above, conventional approaches first employ an over etch to reduce the foot at the bottom of the stack which redeposits a significant amount of dielectric onto the device sidewalls covering over the redeposited metal, thus making effective removal of the redeposited metal extremely difficult.

By way of example only, a high angle denotes a beam angle θ (relative to the surface of the workpiece—see below) of greater than about 60°, e.g., from about 60° to about 80° and ranges therebetween. A low voltage denotes an IBE beam voltage or energy of less than about 300 volts (V), e.g., from about 100V to about 300V and ranges therebetween.

As provided above, landing the stack patterning on the dielectric substrate can create a 'foot' or a 'flare' in the bottom electrode of the memory cells at the interface with the dielectric substrate. In step 106, a low angle IBE is performed to reduce or eliminate this foot at the bottom of the memory cell stacks which is leveraged herein to redeposit the dielectric from the substrate to create a layer of the dielectric encapsulating each of the memory cell stacks. Again, this etch is performed in-situ, meaning that the etch in step 106 is performed in the same vacuum chamber as step 102 and step 104, without breaking vacuum between any of the steps.

By way of example only, a low angle denotes a beam angle θ (relative to the surface of the workpiece—see below) of less than about 40°, e.g., from about 5° to about 40° and ranges therebetween. Notably, the redeposited metal has already been removed (see step 104). Thus, the encapsulating dielectric layer formed in step 106 will not be covering over any redeposited metal along the device sidewalls. Since this in-situ encapsulating layer is formed by redepositing the dielectric from the underlying substrate, the encapsulating layer will have the same composition as the substrate, e.g., SiCN(H), $Al_2O_3$, $SiO_2$, SiN, and/or SiCOH. Further, since the encapsulating dielectric layer is formed in-situ, there is no longer a risk of exposure of the MTJ materials to ambient oxygen and moisture when the workpiece is removed from the vacuum chamber. It is also notable that, even if the foot/flare at the bottom of the memory cell stacks is small, step 106 is still performed to form the encapsulating dielectric layer.

Finally, in step 108 a (second) layer of dielectric is deposited ex-situ onto and encapsulating each of the memory cell stacks. For instance, by way of example only, in step 108 the memory cell stacks are removed from the IBE vacuum chamber, and a deposition process such as plasma enhanced chemical vapor deposition (PECVD) or physical vapor deposition (PVD) is used to deposit a conformal layer of dielectric encapsulant onto the memory cells. Suitable dielectric encapsulants include, but are not limited to, SiCN(H), $Al_2O_3$, $SiO_2$, SiN, and/or SiCOH. As described above, since the in-situ encapsulating dielectric layer (i.e., the 'first layer of dielectric) is already in place along the cell stack sidewalls, there is no longer a risk of exposure of the MTJ materials to ambient oxygen and moisture when the workpiece is removed from the vacuum chamber and the second dielectric encapsulant is deposited ex-situ.

As will be described in detail below, the deposition of the second (ex-situ) layer of dielectric encapsulant over the first (in-situ) layer of dielectric encapsulant results in a unique bilayer dielectric spacer structure. Further, the first (in-situ) layer of dielectric encapsulant and the second (ex-situ) layer of dielectric encapsulant can have a same or different composition as one another. In one exemplary embodiment, these layers have a different composition from one another. To use an illustrative, non-limiting example, in one embodiment the first (in-situ) layer of dielectric encapsulant is formed from SiCN(H) and the second (ex-situ) layer of dielectric encapsulant is formed from SiN. The composition of the first (in-situ) layer of dielectric encapsulant can be configured based on the composition of the dielectric substrate. Further, since the clean up etch (see above) was performed immediately after the stack patterning, the interface between this bilayer dielectric spacer structure and the MTJ is free of metal residue.

Figure 2:
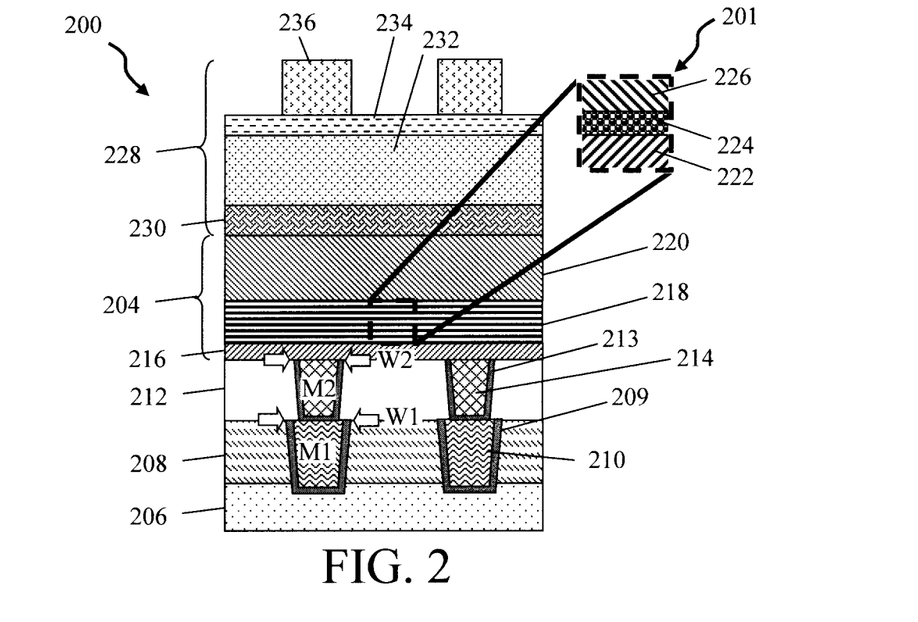
FIG. 2 is a cross-sectional diagram illustrating an MRAM stack (having a bottom electrode, a magnetic tunnel junction (MTJ) and a top electrode) disposed on a dielectric, and a lithographic stack having been formed on the MRAM stack according to an embodiment of the present invention.
Figure 3:
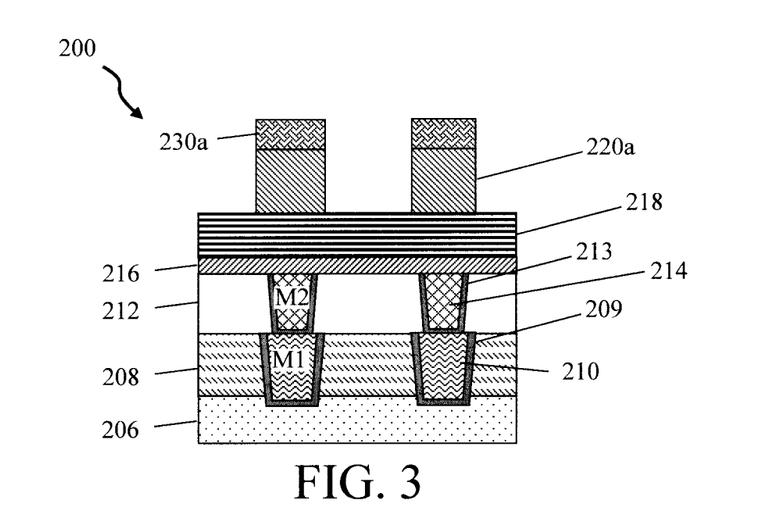
FIG. 3 is a cross-sectional diagram illustrating a hardmask of the lithographic stack having been patterned, and the pattern from the hardmask having been transferred to the top electrode according to an embodiment of the present invention.

Given the above overview of the present techniques, an exemplary methodology for forming an MRAM device is now described by way of reference to FIGS. 2-7. As shown in FIG. 2, the process begins with the formation of a device structure 200 including an MRAM stack 204 on a dielectric substrate.

The non-limiting example depicted in FIG. 2 illustrates how the present techniques can be employed to integrate MRAM devices with various other integrated circuit elements. For instance, a circuit design can be employed including a semiconductor substrate 206. It is to be understood, however, that the present techniques are more broadly applicable to any process where an MRAM device is being fabricated on a dielectric substrate. Thus, the integrated circuit design provided in the figures is merely an example. According to an exemplary embodiment, substrate 206 is a bulk semiconductor wafer, such as a bulk silicon (Si), bulk germanium (Ge), bulk silicon germanium (SiGe) and/or bulk III-V semiconductor wafer. Alternatively, substrate 206 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Although not shown in the figures, semiconductor substrate 206 can contain one or more device elements such as field-effect transistors (FETs), resistors, capacitors, etc. formed using standard complementary metal oxide semiconductor (CMOS)-compatible fabrication processes.

A dielectric 208 is disposed on semiconductor substrate 206. Suitable dielectrics 208 include, but are not limited to, oxide materials such as $SiO_2$ and/or SiCOH and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

Electrically conductive interconnects 210 are present in dielectric 208. Interconnects 210 are formed using standard metallization techniques. For instance, by way of example only, vias are first patterned in the dielectric 208. A barrier/adhesion layer 209 (e.g., tantalum (Ta)/tantalum nitride (TaN)) is deposited into/lining the vias. The vias are then filled with a contact metal(s) (e.g., Cu, Pt, Pd, Ni and/or Au) to form interconnects 210.

Interconnects 210 will connect the MRAM devices (formed in accordance with methodology 100 of FIG. 1, as described below) to the devices, e.g., transistors, in semiconductor substrate 206. However, in order for methodology 100 to be performed to redistribute dielectric for in-situ encapsulation, the landing pad (in this case the interconnect) needs to have a smaller footprint than that of the patterned memory cell stack. This will ensure that the low angle IBE performed as per step 106 of methodology 100 will have access to dielectric at the base of the memory cells (rather than landing pad metal). To do so, it may be necessary to reduce the size of the interconnect on which the MRAM device is formed. For instance, in the present example, this is accomplished by providing a second layer of interconnects 214 (labeled "M2") over the interconnects 210 (labeled "M1") having a reduced footprint, i.e., interconnects 210 have a width W1 and interconnects 214 have a width W2, wherein W2<W1. See FIG. 2.

Namely, a dielectric 212 is deposited onto dielectric 208. Suitable dielectrics 208 include, but are not limited to, SiCN(H), $SiO_2$, SiN, and/or SiCOH. In the same manner as above, vias are then patterned in the dielectric 212. A barrier/adhesion layer 213 (e.g., tantalum (Ta)/tantalum nitride (TaN)) is deposited into/lining the vias. The vias are then filled with a contact metal(s) (e.g., Cu, Pt, Pd, Ni and/or Au) to form interconnects 214.

As shown in FIG. 2, MRAM stack 204 includes a bottom electrode 216 disposed on dielectric 212 over the interconnects 214, an MTJ 218 disposed on the bottom electrode 216, and a top electrode 220 disposed on the MTJ 218. As provided above, each of the bottom and top electrodes 216 and 220 can be formed from a metal such as Cu, Pt, Pd, Ni and/or Au. According to an exemplary embodiment, the bottom electrode 216 has thickness of from about 5 nanometers (nm) to about 20 nm and ranges therebetween, and the top electrode 220 has a thickness of from about 50 nm to about 100 nm and ranges therebetween.

MTJ 218 can have a variety of different configurations. In general however, MTJ 218 includes at least one fixed (or reference) layer 222 separated from at least one free layer 226 by a tunnel barrier 224. See magnified view 201. According to an exemplary embodiment, the fixed layer(s) 222 and the free layer(s) 226 are each formed from a metal such as Co, Fe, Ni, Mn, Pt, Pd, Ru, and combinations thereof, e.g., alloys containing at least one of the foregoing metals such as CoFeB. According to an exemplary embodiment, the tunnel barrier 224 is formed from a metal oxide such as AlOx and/or MgO.

In order to pattern MRAM stack 204, a lithographic stack 228 is formed on the MRAM stack 204. As shown in FIG. 2, lithographic stack 228 includes a hardmask 230 (e.g., SiN) disposed on the MRAM stack 204, an organic planarizing layer (OPL) 232 disposed on the hardmask 230, an antireflective coating (ARC) 234 disposed on the OPL 232, and a patterned photoresist 236 disposed on the ARC 234. The patterned photoresist 236 marks the footprint and location of at least one memory cell that is to be patterned in the MRAM stack 204 over the interconnects 214.

Standard lithography and etching techniques are then employed to transfer the pattern from the patterned photoresist 236 to the hardmask 230, after which any remaining OPL 232, ARC 234 and photoresist 236 are removed. See FIG. 3. The patterned hardmask 230 is now given the reference numeral 230a. The pattern from the patterned hardmask 230a is then transferred to the top electrode 220. The top electrode 220 as patterned is now given the reference numeral 220a. As provided above, the present process can be performed using IBE whereby the workpiece (i.e., device structure 200) is placed in a vacuum chamber, and each of the patterning steps is performed in-situ (without breaking vacuum in between the steps).

Figure 4:
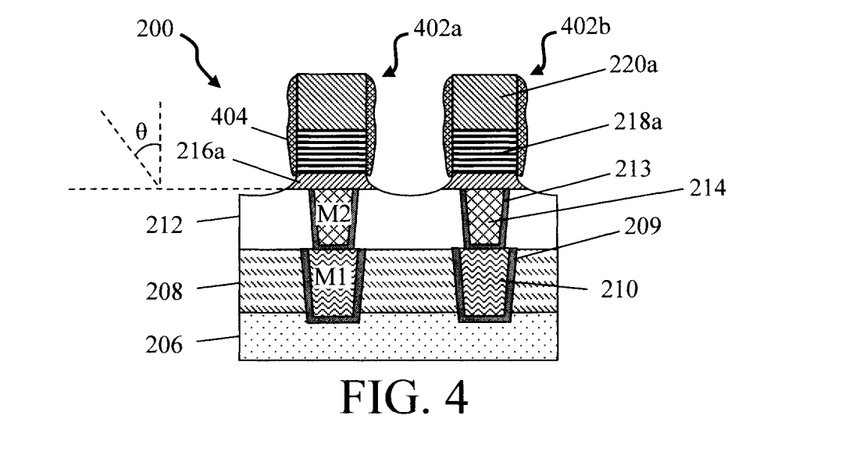
FIG. 4 is a cross-sectional diagram illustrating an etch of the MTJ and bottom electrode having been performed using an intermediate angle ion beam etch (IBE)—landing on the dielectric—to form individual memory cell stacks from the MRAM stack according to an embodiment of the present invention.

Next (as per step 102 of methodology 100—see above), an etch of the MTJ 218 and bottom electrode 216 is performed—landing on dielectric 212—to form individual memory cell stacks 402a, 402b, etc. from the MRAM stack 204. See FIG. 4. The patterned MTJ 218 and bottom electrode 216 are now given the reference numerals 218a and 216a, respectively. As shown in FIG. 4, the pattern from hardmask 230 is transferred to the MTJ 218/bottom electrode 216 via a whole stack etch, thereby avoiding any undesirable changes in diameter midway down the stack as occurs with some conventional approaches (see above). As such, a uniform profile is present along the sidewalls of the memory cell stacks 402a,b, etc. During the etch of MTJ 218a and bottom electrode 216a, the hardmask 230a is completely removed and the patterned top electrode 220a is partially eroded.

As described in accordance with the description of step 102 of methodology 100, above, the etch depicted in FIG. 4 is performed using an intermediate angle IBE, e.g., having a beam angle θ (relative to the surface perpendicular to the workpiece—see below) of from about 40° to about 60° and ranges therebetween. See FIG. 4.

As also shown in FIG. 4, etching the MTJ 218a and bottom electrode 216a redeposits metal (see redeposited metal 404) along the sidewalls of memory cell stacks 402a,b, etc. Namely, IBE of a given layer can redeposit metal from that layer along the already-patterned sidewalls of the above layer(s). This redeposited metal 404 needs to be removed from the sidewalls prior to encapsulation.

To remove the redeposited metal 404 from the sidewalls of memory cell stacks 402a,b, etc. (as per step 104 of methodology 100—see above), a low-voltage (e.g., less than about 300V, e.g., from about 100V to about 300V and ranges therebetween), high angle (e.g., a beam angle θ of greater than about 60°, e.g., from about 60° to about 80° and ranges therebetween) clean-up IBE is used to remove all of the redeposited metal from the sidewalls of memory cell stacks 402a,b, etc. See FIG. 5. As provided above, this clean up etch is performed in-situ, i.e., the same vacuum chamber is used for etching the MTJ 218a and bottom electrode 216a in FIG. 4 as for the clean up etch in FIG. 5, without breaking vacuum between the steps.

Further, while there can be some gouging of the dielectric 212 during this clean up etch (see FIG. 5) it is minimal at best. Thus, only a minimal amount of dielectric 212 gets redeposited onto the sidewalls of memory cell stacks 402a,b, etc. Accordingly, all of the redeposited metal can be more effectively removed since it is not covered over by (redeposited) dielectric 212.

Figure 5:
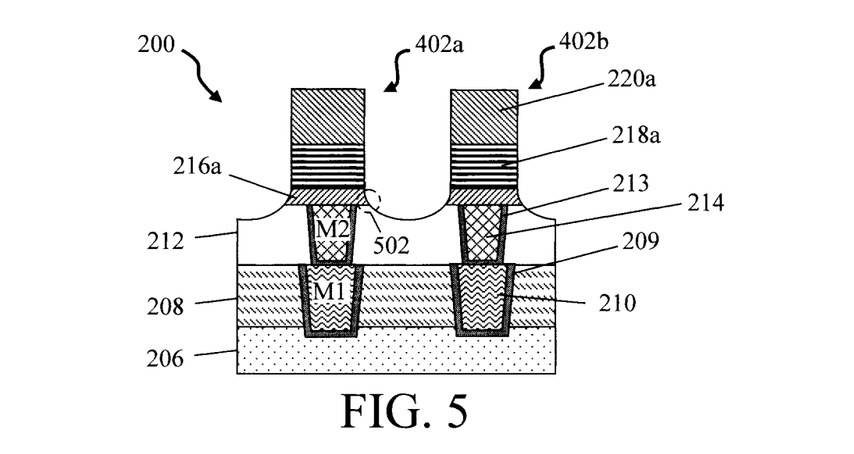
FIG. 5 is a cross-sectional diagram illustrating metal (redeposited during the etch of the MTJ/bottom electrode) having been removed from the sidewalls of memory cell stacks using a low-voltage, high angle IBE according to an embodiment of the present invention.
Figure 6:
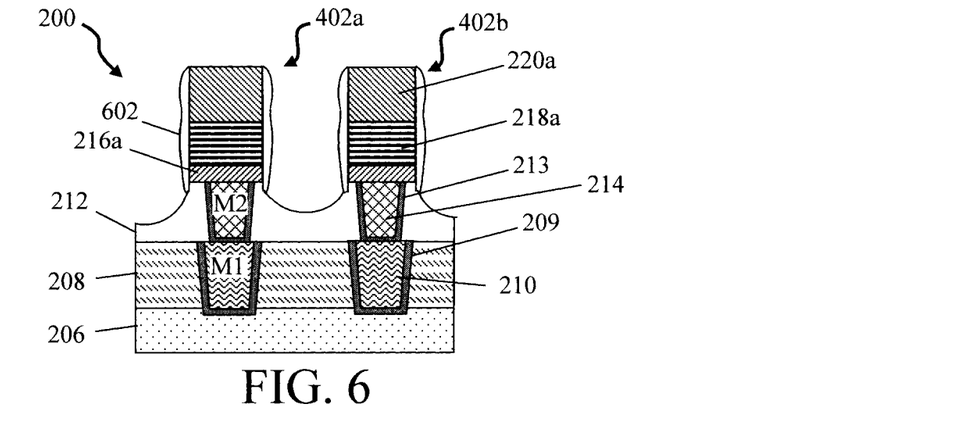
FIG. 6 is a cross-sectional diagram illustrating a low angle IBE having been performed to eliminate a foot at the bottom of the memory cell stacks which also serves to redeposit the dielectric along the sidewalls of memory cell stacks creating a (first) layer of dielectric encapsulating each of the memory cell stacks according to an embodiment of the present invention.

Since the etching of MTJ 218a and bottom electrode 216a lands on the dielectric 212, a 'foot' or a 'flare' (see foot 502) can be created in the bottom electrode of each of the memory cell stacks 402a,b, etc at the interface with the dielectric 212. A low angle IBE (e.g., a beam angle θ of less than about 40°, e.g., from about 5° to about 40° and ranges therebetween) is performed to reduce or eliminate this foot at the bottom of the memory cell stacks (as per step 106 of methodology 100—see above) which also serves to redeposit dielectric 212 along the sidewalls of memory cell stacks 402a,b, etc. creating a layer 602 of the dielectric 212 encapsulating each of the memory cell stacks 402a,b, etc. See FIG. 6. Again, this etch is performed in-situ, meaning that the etch performed as shown in FIG. 6 to remove foot 502 is performed in the same vacuum chamber as the etch performed as shown in FIG. 4 of the MTJ 218 and bottom electrode 216 and the etch performed as shown in FIG. 5 to remove the redeposited metal, without breaking vacuum between any of these steps.

Since the redeposited metal has already been removed (see description of FIG. 5 above), the encapsulating dielectric layer 602 will not be covering over any redeposited metal along the sidewalls of memory cell stacks 402a,b, etc. Further, since this in-situ encapsulating layer is formed by redepositing dielectric 212, layer 602 will have the same composition as dielectric 212, e.g., SiCN(H), $Al_2O_3$, $SiO_2$, SiN, and/or SiCOH. While the step illustrated in FIG. 6 is performed to in part reduce/eliminate foot 502, it is notable that this low angle IBE would be performed even if the foot/flare at the bottom of the memory cell stacks 402a,b, etc. is small in order to form the encapsulating dielectric layer 602.

Figure 7:
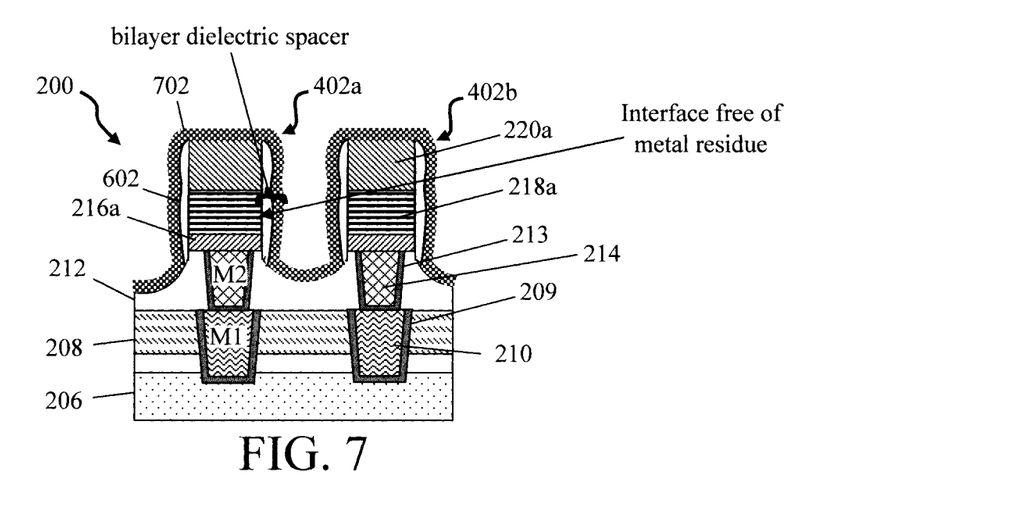
FIG. 7 is a cross-sectional diagram illustrating a (second) layer of dielectric encapsulant having been deposited onto and encapsulating each of the memory cell stacks forming a bilayer dielectric spacer structure with the first layer of dielectric along the sidewalls of the memory cell stacks according to an embodiment of the present invention.

Finally, as shown in FIG. 7, a (second) layer of dielectric 702 encapsulant (wherein dielectric layer 602 is the 'first' dielectric encapsulant) is then deposited ex-situ onto and encapsulating each of the memory cell stacks (as per step 108 of methodology 100—see above). By 'ex-situ,' it is meant that the memory cell stacks 402a,b, etc. are removed from the IBE vacuum chamber, and a deposition process such as PECVD or PVD is used to deposit a conformal layer of dielectric 702 (e.g., SiCN(H), $Al_2O_3$, $SiO_2$, SiN, and/or SiCOH) onto/encapsulating the memory cell stacks 402a,b, etc. Since encapsulating dielectric layer 602 (formed in-situ) is already in place along the sidewalls of memory cell stacks 402a,b, etc., the MTJ 218a is protected from exposure to ambient oxygen and moisture when the workpiece is removed from the vacuum chamber and dielectric 702 is deposited ex-situ.

The ex-situ deposition of (second) layer of dielectric 702 encapsulant over the (first, in-situ deposited) layer of dielectric 602 encapsulant results in a unique bilayer dielectric spacer structure along the sidewalls of the memory cell stacks 402a,b, etc. The composition of the bilayer dielectric spacer structure can vary depending on the composition of the first (in-situ) layer of dielectric 602 encapsulant and the second (ex-situ) layer of dielectric 702 encapsulant. For instance, the first (in-situ) layer of dielectric 602 encapsulant and the second (ex-situ) layer of dielectric 702 encapsulant can have a same or different composition as one another. In one exemplary embodiment, layers 602 and 702 have a different composition from one another. To use an illustrative, non-limiting example, in one embodiment the first (in-situ) layer of dielectric 602 encapsulant is formed from SiCN(H) and the second (ex-situ) layer of dielectric 702 encapsulant is formed from SiN. Based on the above-described process flow, the composition of the first (in-situ) layer of dielectric 602 encapsulant is configured based on the composition of dielectric 212. Further, since the clean up etch (see description of FIG. 5, above) was performed immediately after the stack patterning, the interface between this bilayer dielectric spacer structure and the MTJ 218a is free of metal residue.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a magnetic random access memory (MRAM) device, the method comprising the steps of:
    patterning an MRAM stack disposed on a dielectric into individual memory cell stacks, wherein the MRAM stack comprises a bottom electrode disposed on the dielectric, a magnetic tunnel junction (MTJ) disposed on the bottom electrode, and a top electrode disposed on the MTJ, and wherein the patterning of the MRAM stack is performed using an intermediate angle ion beam etch (IBE) landing on the dielectric;
    removing redeposited metal from sidewalls of the memory cell stacks using a high angle IBE, wherein the redeposited metal results from the patterning of the MRAM stack;
    redepositing the dielectric along the sidewalls of the memory cell stacks using a low angle IBE to form a first layer of dielectric encapsulating the memory cell stacks; and
    depositing a second layer of dielectric encapsulating the memory cell stacks, wherein the first layer of dielectric and the second layer of dielectric form a bilayer dielectric spacer structure along the sidewalls of the memory cell stacks,
    wherein the patterning of the MRAM stack, the removing of the redeposited metal, and the redepositing of the dielectric along the sidewalls of the memory cell stacks steps are all performed in-situ in a vacuum chamber, without breaking vacuum.

2. The method of claim 1, wherein the MTJ comprises:
    at least one fixed layer;
    at least one free layer; and
    at least one tunnel barrier separating the at least one fixed layer from the at least one free layer.

3. The method of claim 1, wherein the at least one fixed layer and the at least one free layer are each formed from a metal selected from the group consisting of: cobalt (Co), iron (Fe), nickel (Ni), manganese (Mn), platinum (Pt), palladium (Pd), ruthenium (Ru), cobalt iron boron (CoFeB) and combinations thereof, and wherein the tunnel barrier is formed from a metal oxide selected from the group consisting of: aluminum oxide (AlOx), magnesium oxide (MgO), and combinations thereof.

4. The method of claim 1, wherein the dielectric comprises a material selected from the group consisting of: silicon carbonitride (SiCN(H)), silicon dioxide ($SiO_2$), silicon nitride (SiN), silicon oxycarbide (SiCOH), and combinations thereof.

5. The method of claim 1, wherein the dielectric comprises interconnects formed therein, and wherein a footprint of each of the interconnects is smaller than a footprint of each of the memory cell stacks.

6. The method of claim 1, wherein the intermediate angle IBE comprises a beam angle of from about 40° to about 60° and ranges therebetween.

7. The method of claim 1, wherein the high angle IBE comprises a beam angle of greater than about 60°.

8. The method of claim 1, wherein the high angle IBE is performed at a beam voltage of less than 300 volts (V).

9. The method of claim 1, wherein the low angle IBE comprises a beam angle of less than about 40°.

10. The method of claim 1, wherein the second layer of dielectric comprises a material selected from the group consisting of: SiCN(H), $SiO_2$, SiN, SiCOH, and combinations thereof.

11. The method of claim 1, wherein the first layer of dielectric and the second layer of dielectric have a different composition from one another.

12. The method of claim 11, wherein the first layer of dielectric comprises SiCN(H), and wherein the second layer of dielectric comprises SiN.

13. The method of claim 1, wherein an interface between the bilayer dielectric spacer and the MTJ in the memory cell stacks is free of metal residue.

* * * * *